(12) United States Patent
Song et al.

(10) Patent No.: US 7,741,168 B2
(45) Date of Patent: Jun. 22, 2010

(54) SYSTEMS AND METHODS FOR FABRICATING NANOMETRIC-SCALE SEMICONDUCTOR DEVICES WITH DUAL-STRESS LAYERS USING DOUBLE-STRESS OXIDE/NITRIDE STACKS

(75) Inventors: Seung-Chul Song, Austin, TX (US);
Joel Barnett, Austin, TX (US); Byong Sun Ju, Pundanggu (KR)

(73) Assignee: Sematech, Inc., Austin, TX (US)

( * ) Notice: Subject to any disclaimer, the term of this patent is extended or adjusted under 35 U.S.C. 154(b) by 407 days.

(21) Appl. No.: 11/782,984

(22) Filed: Jul. 25, 2007

(65) Prior Publication Data

US 2009/0026548 A1 Jan. 29, 2009

(51) Int. Cl.
*H01L 21/8238* (2006.01)
(52) U.S. Cl. .............. 438/199; 438/229; 257/E27.062; 257/E21.632
(58) Field of Classification Search .......... 257/369, 257/E27.062, E21.632, E21.24, E29.255; 438/199, 229
See application file for complete search history.

(56) References Cited

U.S. PATENT DOCUMENTS

| 2007/0105299 A1 | 5/2007 | Fang et al. ............. 438/199 |
| 2008/0206943 A1* | 8/2008 | Chen et al. ............. 438/229 |
| 2008/0296682 A1* | 12/2008 | Zhu et al. ............. 257/347 |
| 2009/0309166 A1* | 12/2009 | Shima ............. 257/369 |

OTHER PUBLICATIONS

Yang et al., "Dual stress liner for high performance sub-45nm gate length of SOI CMOS manufacturing." Electron Devices Meeting, 2004. IEDM Technical Digest. IEEE International, 1075-1077, 2004.
Pidin et al., "MOSFET current drive optimization using silicon nitride capping layer for 65-nm technology node," VLSI Technology, 2004. Digest of Technical Papers, 54-55, 2004.
Goto et al., "Technology booster using strain-enhancing laminated SiN (SELS) for 65nm node HP MPUs," Electron Devices Meeting, 2004. IEDM Technical Digest. IEEE International, 209-212, 2004.

* cited by examiner

*Primary Examiner*—David S Blum
(74) *Attorney, Agent, or Firm*—Fulbright & Jaworski L.L.P.

(57) ABSTRACT

Systems and methods for fabricating semiconductor devices with dual-stress layers using double-stress oxide/nitride stacks. A method comprises providing NMOS and PMOS regions, selectively forming a dual-stack tensile stress layer over the NMOS region by depositing a tensile silicon nitride layer over the NMOS and PMOS regions, depositing a tensile silicon oxide layer over the tensile silicon nitride layer, removing a portion of the tensile silicon oxide layer from the PMOS region, and removing a portion of the tensile silicon nitride layer from the NMOS region and selectively forming a dual stack compressive stress layer over the PMOS region by depositing a compressive silicon nitride layer over the NMOS and PMOS regions, depositing a compressive silicon oxide layer over the compressive silicon nitride layer, removing a portion of the compressive silicon oxide layer from the NMOS region, and removing a portion of the compressive silicon nitride layer from the NMOS region.

19 Claims, 2 Drawing Sheets

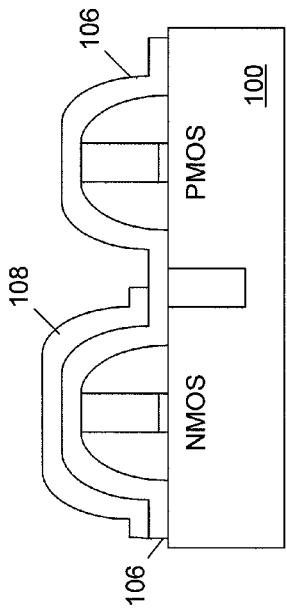
FIG. 1
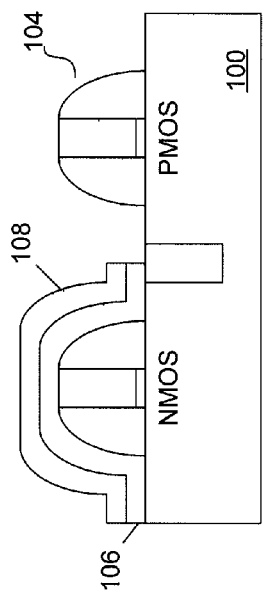
FIG. 2
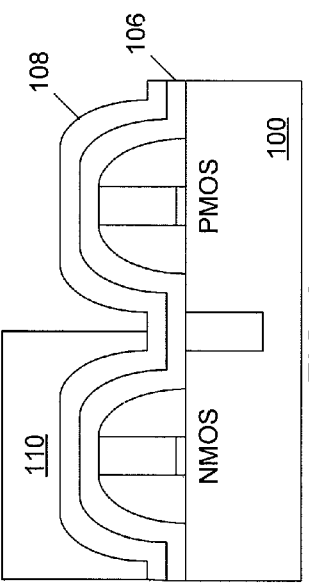
FIG. 3
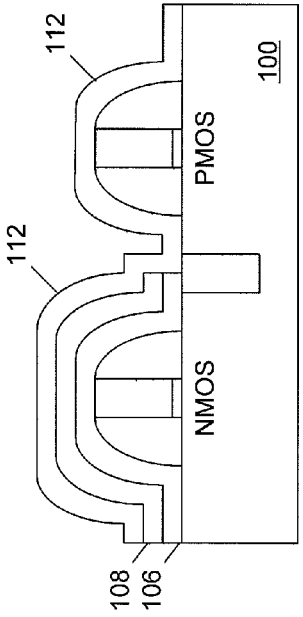
FIG. 4
FIG. 5
FIG. 6

SYSTEMS AND METHODS FOR FABRICATING NANOMETRIC-SCALE SEMICONDUCTOR DEVICES WITH DUAL-STRESS LAYERS USING DOUBLE-STRESS OXIDE/NITRIDE STACKS

BACKGROUND OF THE INVENTION

1. Field of the Invention

The present invention relates generally to semiconductor fabrication and, more particularly, to systems and methods for fabricating nanometric-scale semiconductor devices with dual-stress layers using double-stress oxide/nitride stacks.

2. Description of Related Art

As semiconductor devices are scaled down to nanometric sizes, it becomes increasingly difficult to improve device performance. For example, conventional device scaling reducing channel length below 100 nm does not improve device performance usually expected in larger channel length due to carrier velocity saturation. Other factors such as gate dielectric scaling present further problems. Some techniques have been developed to increase the device performance including inducing a local mechanical stress upon the channel of a device. These techniques include inducing compressive stress by shallow trench isolation (STI), embedding silicon-germanium (SiGe) in the source and/or drain regions of the device, and introducing a nitride layer at a contact etch stop layer level.

BRIEF SUMMARY OF THE INVENTION

The present invention provides systems and methods for fabricating nanometric-scale semiconductor devices with dual-stress layers using double-stress oxide/nitride stacks. In one embodiment, a method comprises providing a semiconductor structure having an N-type metal-oxide (NMOS) region and a P-type metal-oxide (PMOS) region, depositing a tensile silicon nitride layer over the NMOS and PMOS regions, depositing a tensile silicon oxide layer over the tensile silicon nitride layer, forming a first photoresist over a first portion of the tensile silicon oxide layer above the NMOS region, removing a second portion of the tensile silicon oxide layer above the PMOS region and a first portion of the tensile silicon nitride layer above the PMOS region, depositing a compressive silicon nitride layer over the PMOS region and the first portion of the tensile silicon oxide layer above the NMOS region, depositing a compressive silicon oxide layer over the compressive silicon nitride layer, forming a second photoresist over a first portion of the compressive silicon oxide layer above the PMOS region, removing a second portion of the compressive silicon oxide layer above the NMOS region, and removing the a first portion of the compressive silicon nitride layer above the NMOS region.

In another embodiment, a method comprises providing a semiconductor wafer having an N-type metal-oxide (NMOS) region and a P-type metal-oxide (PMOS) region, depositing a first tensile material layer over the NMOS and PMOS regions, depositing a second tensile material layer over the first tensile material layer, forming a first photoresist over a first portion of the second tensile material layer above the NMOS region, removing a second portion of the second tensile material layer above the PMOS region, and removing a first portion of the first tensile material layer above the PMOS region. The method may further comprise depositing a first compressive material layer over the PMOS region and the first portion of the second tensile material layer above the NMOS region, depositing a second compressive material layer over the first compressive material layer, forming a second photoresist over a first portion of the second compressive material layer above the PMOS region, removing a second portion of the second compressive material layer above the NMOS region, and removing the a first portion of the first compressive material layer above the NMOS region.

In yet another embodiment, a method comprises providing a semiconductor device with an NMOS region and a PMOS region, selectively forming a dual-stack tensile stress layer over the NMOS region by depositing a tensile silicon nitride layer over the NMOS and PMOS regions, depositing a tensile silicon oxide layer over the tensile silicon nitride layer, removing a portion of the tensile silicon oxide layer from the PMOS region, and removing a portion of the tensile silicon nitride layer from the NMOS region, and selectively forming a dual stack compressive stress layer over the PMOS region by depositing a compressive silicon nitride layer over the NMOS and PMOS regions, depositing a compressive silicon oxide layer over the compressive silicon nitride layer, removing a portion of the compressive silicon oxide layer from the NMOS region, and removing a portion of the compressive silicon nitride layer from the NMOS region.

In still another embodiment, a semiconductor wafer comprises at least one NMOS region and at least one PMOS region, a dual-stack tensile stress layer over the at least one NMOS region, the dual-stack tensile stress layer having a tensile silicon oxide layer over a tensile silicon nitride layer, and a dual-stack compressive stress layer over the PMOS region, the dual-stack compressive stress layer having a compressive silicon oxide layer over a compressive silicon nitride layer.

The term "coupled" is defined as connected, although not necessarily directly, and not necessarily mechanically. The terms "a" and "an" are defined as one or more unless this disclosure explicitly requires otherwise. The term "substantially," "about," and its variations are defined as being largely but not necessarily wholly what is specified as understood by one of ordinary skill in the art, and in one non-limiting embodiment, the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE SEVERAL VIEWS OF THE DRAWINGS

The following drawings form part of the present specification and are included to further demonstrate certain aspects of the present invention. The invention may be better understood by reference to one or more of these drawings in combination with the detailed description of specific embodiments presented herein.

FIGS. 1-11 show cross-section views of a semiconductor device undergoing fabrication steps for integrating a tensile nitride layer and a compressive nitride layer to optimize performance of nMOSFET and pMOSFET devices on a single wafer or die.

DETAILED DESCRIPTION OF THE INVENTION

Figure 7:
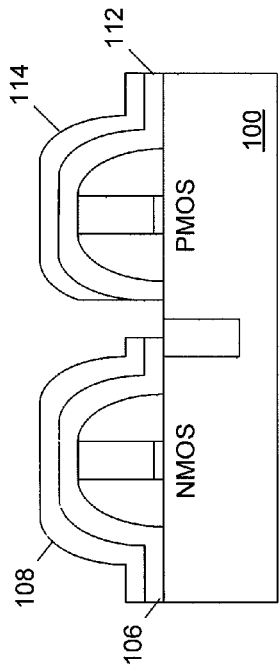
Figure 8:
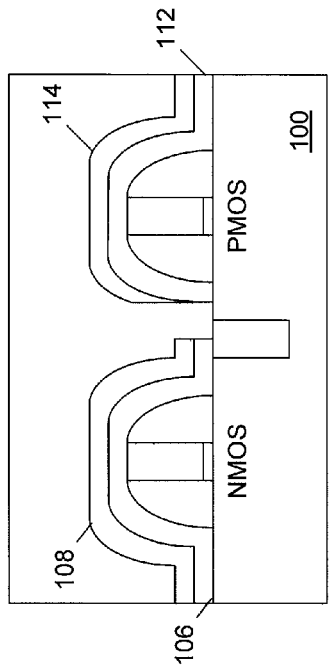

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The inventors hereof have discovered that local mechanical stress typically created in the device channel may sometimes impair carrier mobility and cause undesirable layout-related performance variations. In light of this discovery, the inventors hereof have recognized that the optimal stress type and direction with respect to current flow is different for N-type metal-oxide-semiconductor field-effect transistors (nMOSFETs) and P-type metal-oxide-semiconductor field-effect transistors (pMOSFETs). In other words, performance improvements are generally dependent upon stress polarity. For example, whereas the application of a tensile stress may enhance performance of nMOSFETs, the application of a compressive stress may improve the performance of pMOSFETs.

Furthermore, the inventors have also recognized that it would be advantageous to provide a method of fabricating devices with dual-stress layers using double-stress oxide/nitride stacks. In one embodiment, a stress contact etch stop layer technique may be used. Also, the process flow may provide a double-stress layer on both N-type and P-type regions of the semiconductor device. These layers may remain in the final structure to serve, for example, as stop etch layers.

Accordingly, one exemplary embodiment of the present invention provides systems and methods for using multiple stress layers to improve performance of nMOSFET and pMOSFET devices. The two stress layers may be, for example, a tensile silicon nitride layer and a compressive silicon nitride layer. These layers may be deposited on the same wafer or die selective to a NMOS or PMOS region. An additional layer such as, for instance, a tensile oxide layer, may be introduced between the two stress layers and serve as an etch-stop layer to improve process flow.

Referring to FIGS. 1 through 11, fabrication steps for integrating a tensile nitride layer and a compressive nitride layer to optimize the performance of nMOSFET and pMOSFET devices on a single wafer are illustrated.

In a first step shown in FIG. 1, NMOS region 102 and PMOS region 104 are provided on substrate 100. In a next step shown in FIG. 2, tensile silicon nitride layer 106 may be deposited over NMOS region 102 and PMOS region 104. In a subsequent step shown in FIG. 3, tensile silicon oxide layer 108 may be deposited onto tensile silicon nitride layer 106, and photoresist layer 110 may be formed over a first portion of the tensile silicon oxide layer (above NMOS region 102). As shown in FIG. 4, a second portion of tensile silicon oxide layer 108 (above PMOS region 104) may be selectively etched along with other areas not protected by photoresist layer 110. Photoresist layer 110 may be subsequently removed. Next, using tensile silicon oxide layer 108 as a hardmask layer, a first portion of tensile silicon nitride layer 106 (above PMOS region 104) may be removed (e.g., via etching), as shown in FIG. 5. In one alternative embodiment, the second portion of tensile silicon oxide layer 108 (above PMOS region 104) may be removed together with first portion of tensile silicon nitride layer 106 (above PMOS region 104) in a single etching step with photomask 110 still on the device.

Figure 9:
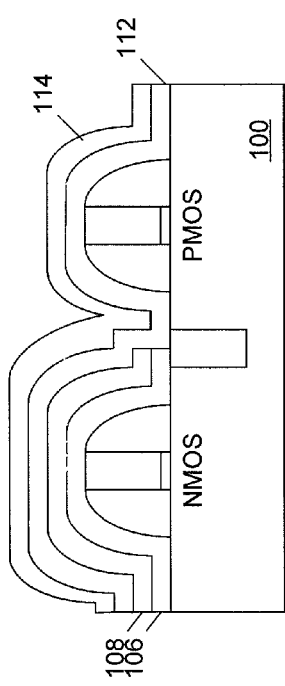
Figure 10:
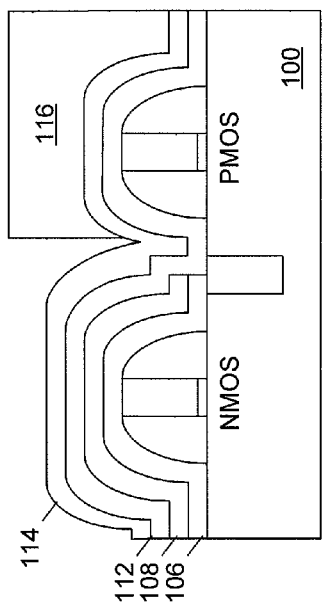
Figure 11:
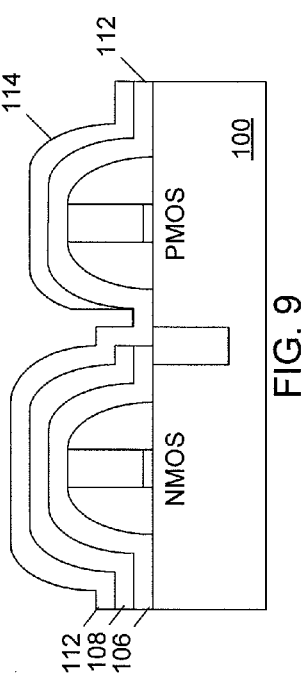

In another step shown in FIG. 6, compressive silicon nitride layer 112 may be deposited over PMOS region 104 and the first portion of tensile silicon oxide layer (above NMOS region 102). Thereafter, compressive silicon oxide layer 114 may be deposited over compressive silicon nitride layer 112, as shown in FIG. 7. In the next step shown in FIG. 8, photoresist layer 116 may be formed over a first portion of compressive silicon oxide layer 114 (above PMOS region 104). As FIG. 9 shows, a second portion of compressive silicon oxide layer 114 (above NMOS region 102) may be selectively etched along with other areas not protected by photoresist 116, followed by removal of photoresist layer 116. Using the remaining compressive oxide layer 114 as a hardmask layer, a first potion of compressive silicon nitride layer 112 (above NMOS region 102) may be etched, and the resultant semiconductor device is shown in FIG. 10. In an alternative embodiment, the second portion of compressive silicon oxide layer 114 (above NMOS region 102) may be removed together with the first potion of compressive silicon nitride layer 112 (above NMOS region 102) in a single etching step with photomask 116 still on the device. A pre-metal dielectric deposition (PMD) and subsequent chemical mechanical polish (CMP) may follow, thus yielding in the structure shown in FIG. 11 with dielectric layer 118.

Deposition processes that may be used in connection with one or more of the above steps include Plasma Enhanced Chemical Vapor Deposition (PECVD), Atomic Layer Deposition (ALD), Physical Vapor Deposition (PVD) or conventional Chemical Vapor Deposition (CVD). Meanwhile, etching processes may include dry etch, a chemical wet etch, or a combination thereof.

All of the methods disclosed and claimed herein can be executed without undue experimentation in light of the present disclosure. While the methods of this disclosure may have been described in terms of preferred embodiments, it will be apparent to those of ordinary skill in the art that variations may be applied to the methods and in the steps or in the sequence of steps of the method described herein without departing from the concept, spirit and scope of the disclosure. All such similar substitutes and modifications apparent to those skilled in the art are deemed to be within the spirit, scope, and concept of the disclosure as defined by the appended claims.

We claim:

1. A method comprising:
   providing a semiconductor structure having an N-type metal-oxide (NMOS) region and a P-type metal-oxide (PMOS) region;
   depositing a tensile silicon nitride layer over the NMOS and PMOS regions;

depositing a tensile silicon oxide layer over the tensile silicon nitride layer;

forming a first photoresist over a first portion of the tensile silicon oxide layer above the NMOS region;

removing a second portion of the tensile silicon oxide layer above the PMOS region and a first portion of the tensile silicon nitride layer above the PMOS region;

depositing a compressive silicon nitride layer over the PMOS region and the first portion of the tensile silicon oxide layer above the NMOS region;

depositing a compressive silicon oxide layer over the compressive silicon nitride layer;

forming a second photoresist over a first portion of the compressive silicon oxide layer above the PMOS region; and removing a second portion of the compressive silicon oxide layer above the NMOS region and removing the a first portion of the compressive silicon nitride layer above the NMOS region.

2. The method of claim 1, the tensile silicon oxide layer preventing removal of a second portion of the tensile silicon nitride layer above the NMOS region during removal of the first portion of the tensile silicon nitride layer above the PMOS region.

3. The method of claim 1, further comprising removing the first photoresist before removing the first portion of the tensile silicon nitride layer above the PMOS region.

4. The method of claim 1, the compressive silicon oxide layer preventing removal of a second portion of the compressive silicon nitride layer above the PMOS region during removal of the first portion of the compressive silicon nitride layer above the NMOS region.

5. The method of claim 1, further comprising removing the second photoresist before removing the first portion of the compressive silicon nitride layer above the NMOS region.

6. A method comprising:

providing a semiconductor wafer having an N-type metal-oxide (NMOS) region and a type metal-oxide (PMOS) region;

depositing a first tensile material layer over the NMOS and PMOS regions;

depositing a second tensile material layer over the first tensile material layer;

forming a first photoresist over a first portion of the second tensile material layer above the NMOS region;

removing a second portion of the second tensile material layer above the PMOS region; and removing a first portion of the first tensile material layer above the PMOS region.

7. The method of claim 6, first tensile material layer comprising a tensile silicon nitride layer.

8. The method of claim 6, the second tensile material layer comprising a tensile silicon oxide layer.

9. The method of claim 6, the second tensile material layer preventing removal of a second portion of the first tensile material layer above the NMOS region during removal of the first portion of the first tensile material layer above the PMOS region.

10. The method of claim 6, further comprising removing the first photoresist before removing the first portion of the first tensile material layer above the PMOS region.

11. The method of claim 6, where the removing steps occur in a single step.

12. The method of claim 6, further comprising:

depositing a first compressive material layer over the PMOS region and the first portion of the second tensile material layer above the NMOS region;

depositing a second compressive material layer over the first compressive material layer;

forming a second photoresist over a first portion of the second compressive material layer above the PMOS region;

removing a second portion of the second compressive material layer above the NMOS region; and removing the a first portion of the first compressive material layer above the NMOS region.

13. The method of claim 12, the first compressive material layer comprising a compressive silicon nitride layer.

14. The method of claim 12, the second compressive material layer comprising a compressive silicon oxide layer.

15. The method of claim 12, the second compressive material layer preventing removal of a second portion of the first compressive material layer above the PMOS region during removal of the first portion of the first compressive material layer above the NMOS region.

16. The method of claim 12, further comprising removing the second photoresist before removing the first portion of the first compressive material layer above the NMOS region.

17. The method of claim 12, where the removing steps occur in a single step.

18. The method of claim 12, the NMOS and PMOS regions being on a same die.

19. A method comprising:

providing a semiconductor device with an NMOS region and a PMOS region;

selectively forming a dual-stack tensile stress layer over the NMOS region by depositing a tensile silicon nitride layer over the NMOS and PMOS regions, depositing a tensile silicon oxide layer over the tensile silicon nitride layer, removing a portion of the tensile silicon oxide layer from the PMOS region, and removing a portion of the tensile silicon nitride layer from the NMOS region; and selectively forming a dual stack compressive stress layer over the PMOS region by depositing a compressive silicon nitride layer over the NMOS and PMOS regions, depositing a compressive silicon oxide layer over the compressive silicon nitride layer, removing a portion of the compressive silicon oxide layer from the NMOS region, and removing a portion of the compressive silicon nitride layer from the NMOS region.

* * * * *

UNITED STATES PATENT AND TRADEMARK OFFICE
CERTIFICATE OF CORRECTION

PATENT NO. : 7,741,168 B2 Page 1 of 1
APPLICATION NO. : 11/782984
DATED : June 22, 2010
INVENTOR(S) : Seung-Chul Song et al.

It is certified that error appears in the above-identified patent and that said Letters Patent is hereby corrected as shown below:

In claim 6, column 5, line 39, delete "a type" and insert --a P-type-- therefor.

Signed and Sealed this

Seventh Day of September, 2010

David J. Kappos
*Director of the United States Patent and Trademark Office*